United States Patent
Deacon et al.

(10) Patent No.: US 6,476,362 B1
(45) Date of Patent: Nov. 5, 2002

(54) LAMP ARRAY FOR THERMAL PROCESSING CHAMBER

(75) Inventors: Thomas E. Deacon; Roger N. Anderson, both of Sunnyvale; David K. Carlson, Santa Clara; Paul Comita, Menlo Park, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/660,565

(22) Filed: Sep. 12, 2000

(51) Int. Cl.[7] .................................. F27B 5/14
(52) U.S. Cl. .................. 219/390; 219/405; 219/411; 392/416; 392/418; 118/724; 118/50.1
(58) Field of Search ................. 219/390, 405, 219/411; 392/416, 418; 118/724, 725, 50.1

(56) References Cited

U.S. PATENT DOCUMENTS

| | | |
|---|---|---|
| 2,387,807 A | 10/1945 | Miskella |
| 4,493,977 A | 1/1985 | Arai et al. |
| 4,832,777 A | 5/1989 | Davis et al. |
| 5,108,792 A * | 4/1992 | Anderson et al. .......... 427/248.1 |
| 5,179,677 A | 1/1993 | Anderson et al. |
| 5,248,636 A | 9/1993 | Davis et al. |
| 5,345,534 A | 9/1994 | Najm et al. |
| 5,399,523 A | 3/1995 | Kakoschke |
| 5,436,172 A | 7/1995 | Moslehi |
| 5,444,815 A * | 8/1995 | Lee et al. .................... 392/416 |
| 5,446,825 A | 8/1995 | Moslehi et al. |
| 5,467,220 A | 11/1995 | Xu |
| 5,556,275 A | 9/1996 | Sakata et al. |
| 5,595,241 A | 1/1997 | Jelinek |
| 5,762,713 A | 6/1998 | Paranjpe |
| 5,792,273 A | 8/1998 | Ries et al. |
| 5,856,652 A | 1/1999 | Mayuzumi |
| 5,889,258 A * | 3/1999 | Lubomirski et al. ......... 219/405 |
| 5,930,456 A | 7/1999 | Vosen |
| 5,937,142 A | 8/1999 | Moslehi et al. |
| 6,167,195 A * | 12/2000 | Moslehi et al. .............. 392/418 |

FOREIGN PATENT DOCUMENTS

| | | |
|---|---|---|
| EP | 0 695 922 A1 | 2/1996 |
| GB | 2 181 459 A | 4/1987 |
| JP | 56-034627 | 8/1981 |
| JP | 56-036927 | 8/1981 |
| JP | 07-099737 | 4/1995 |

* cited by examiner

Primary Examiner—Teresa Walberg
Assistant Examiner—Shawntina Fuqua
(74) Attorney, Agent, or Firm—Blakely Sokoloff Taylor & Zafman (57) ABSTRACT

A lamp array for a thermal processing chamber. The lamp array includes a plurality of lamps arranged in a generally circular array. The plurality of lamps can be arranged in one or more concentric rings to form a generally circular array. Additional lamp arrays can be provided adjacent the circumference of the circular array or outermost concentric ring to provide a generally rectangular heating pattern. At least one row of lamps can be provided tangentially to the circular portion of the lamp array to provide preheating or postheating of process gases in the flow direction of a rectangular processing chamber.

35 Claims, 10 Drawing Sheets

LAMP ARRAY FOR THERMAL PROCESSING CHAMBER

FIELD OF THE INVENTION

The present invention relates generally to the field of substrate processing for semiconductor manufacturing and, more specifically, to lamp arrays for thermal processing chambers.

BACKGROUND OF THE INVENTION

An important part of integrated circuit manufacturing is processing of the semiconductor substrate in which active devices such as transistors and capacitors that comprise the integrated circuit are formed. Processing of the substrate includes growth of an epitaxial silicon or polysilicon layer, the formation of a thermal oxide or thermal nitride layer over silicon, or etching of portions of previously deposited layers. These exemplary processes are typically performed in thermal process chambers. Process chambers typically include a platform such as a susceptor or an edge ring, a substrate support mechanism, a quartz housing or cover, and an array of lamps that provide radiant heat energy to the interior of the chamber and the substrate being processed.

The semiconductor substrate is typically in a form of a generally round silicon wafer that rests on a top surface or in a pocket of a substrate holding platform. The substrate holding platform is typically inside of a generally rectangular chamber housing. The gas flow is provided from one end of the chamber to the other end of the chamber. The process gas is injected into the chamber across the width of the chamber such that the process gas forms a rectangular flow field across the generally round substrate.

Deposition and etching are typically performed in thermal processing chambers by flowing gases that include certain chemical species over the heated substrate surface. The chemical species react at the substrate surface to deposit layers of material onto the substrate or to etch portions of layers of material from the substrate. The process chamber typically includes a gas inlet port at one end and a gas outlet port at an opposite end.

The array of lamps provides radiant heat energy to the water or sutstrate such that the chemical species in the process gas react at the wafer surface. The deposition reaction results in a change in the process gas composition (i.e., depletion of the gas species) in the direction of the gas flow. For this reason, some chambers are provided with a mechanism to rotate the wafer holder that carries the substrate such that the reaction rate at the surface of the substrate is averaged out to provide uniformity of thickness of the deposition or of depth of etching along the entire surface.

Considerable effort has been expended toward the design of thermal processing chambers for semiconductor substrates in an effort to achieve improved uniformity of thickness of deposition on the surface of semiconductor substrates and uniformity of depth of etching of material from the substrate surface. For instance, various substrate holding trays and platforms that hold a substrate during processing have been designed to provide uniform and consistent heating of the substrate during processing. Also, rotation mechanisms have been provided to rotate the substrate holding platform during processing.

In order to achieve uniform process gas depletion, various heat sources have been designed. The design of the heat source of a thermal processing chamber can also have an effect on the uniformity of deposition or etching of the semiconductor substrate. A heat source such as a lamp array can provide heat uniformly across the width of a rectangular process chamber housing such that the process gas flow field is heated uniformly across such width. A rectangular heat pattern, however, does not provide an ideal thermal profile on a circular wafer because the rectangular heat profile is transposed on the circular profile of the substrate. The four edges of the rectangular heat pattern are therefore closer to the circular substrate at points near the middle of each edge while the corners of the rectangular heat pattern are further away from the circular substrate. Thus, the temperature profile of the circular substrate at areas closer to the corners of the rectangular heat pattern can be different than the temperature profile of the circular substrate at locations near the edges of the rectangular heat pattern.

In order to minimize the variation of the thermal profile of the substrate, generally circular heat sources have been developed. Circular heat sources more closely match the circular profile of the substrate, and therefore provide a more uniform temperature profile at all points of the circular substrate. A circular heat source, however, does not uniformly heat the process gas as it flows across the surface of the substrate in a rectangular flow field. The process gas is injected across the width of the rectangular process chamber and moves across the wafer. The process gas becomes heated at the leading edge of the circular wafer by the circular heat source. As the rectangular flow field of the process gas continues across the wafer, the heated zone becomes wider until the middle of the circular substrate is reached and then becomes narrower until the flow field proceeds completely across the substrate. As a result, the depletion of the process gas is greater over the central diameter of the substrate (parallel to the gas flow direction) because that portion of the process gas is heated over a longer period of time than a portion of the process gas that crosses a shorter chord of the circular profile of the substrate.

In an attempt to overcome the non-uniform depletion effects of a circular heat source and also the non-uniform thermal profile resulting from a rectangular heat source, considerable effort has been made to provide mechanisms by which the substrate is rotated or tilted in order to exploit the depletion effects of the process gas. Additional mechanism or process steps, however, introduce process variables that can potentially cause defects if not controlled within required process parameters.

SUMMARY OF THE INVENTION

In one embodiment, a lamp array for a thermal processing chamber includes a plurality of lamps arranged in at least two concentric rings. In other embodiments, corner lamp arrays are positioned around the circumference of a circular lamp array to provide a generally rectangular heating pattern. In yet other embodiments, rows of end lamps can be positioned tangentially with respect to the circular portion of a lamp array to provide preheating and postheating of processes gases.

BRIEF DESCRIPTION OF THE DRAWINGS

The present invention is illustration by way of example, and not limitation, in figures of the accompanying drawings in which.

DETAILED DESCRIPTION OF INVENTION

Embodiments of lamp arrays for semiconductor substrate thermal processing chambers are described herein. In one embodiment, a lamp array for a semiconductor substrate thermal processing chamber includes a plurality of lamps arranged in concentric rings for improved temperature control and heating efficiency. Ring reflectors between concentric rings confine the radiant energy of each ring to an annular area to be heated. The length of the ring reflectors can be adjusted to control the amount of overlap of radiant energy between adjacent annular areas.

In another embodiment, a lamp array includes a generally circular array of heating lamps defining two diameters and at least one lamp adjacent the circular array at each end of each of the two diameters. The additional lamps adjacent the circular array provide a generally rectangular heating pattern such that the process gas depletion rate is more uniform across the width of the flow field in a rectangular process chamber. The circular array also provides a better thermal profile on the substrate than a rectangular lamp array that includes lineal lamps. In another embodiment, a lamp array includes an additional row of lamps positioned generally tangentially to a circular array for preheating and/or postheating of process gases.

Embodiments of semiconductor processing chambers described herein include a platform that defines a semiconductor substrate holding area, such as a susceptor with or without a pocket, or an edge ring. The various lamp arrays of the present invention can be used with the various examples of thermal processing chambers described, but are not limited to the specific chambers described. For instance, processing chambers can but do not necessarily need to include rotation mechanisms for the susceptor or edge ring.

Figure 1:
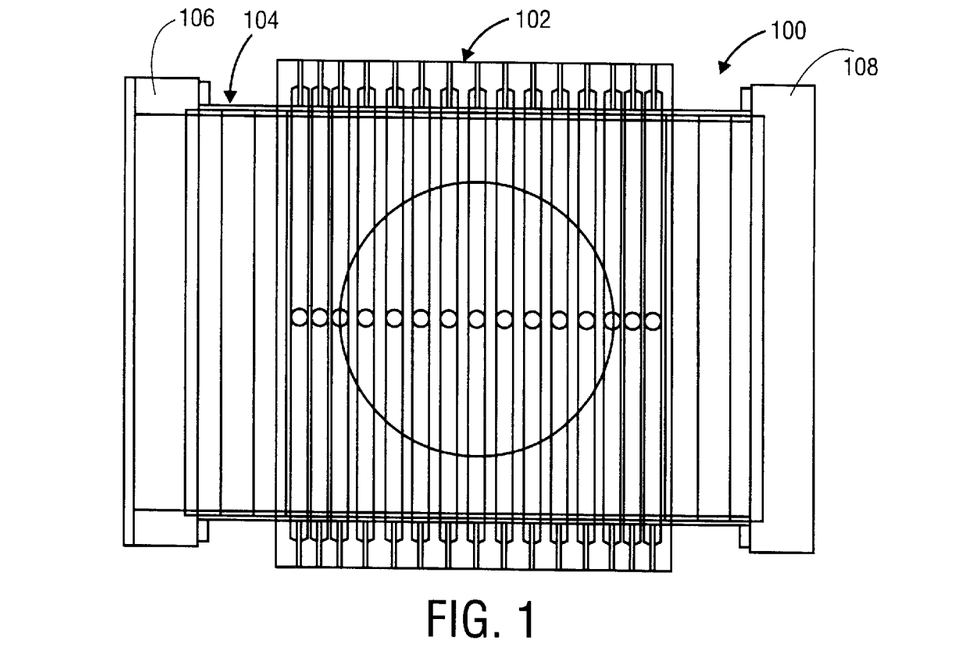
FIG. 1 is a top view of a thermal processing chamber including a linear lamp array.
Figure 2:
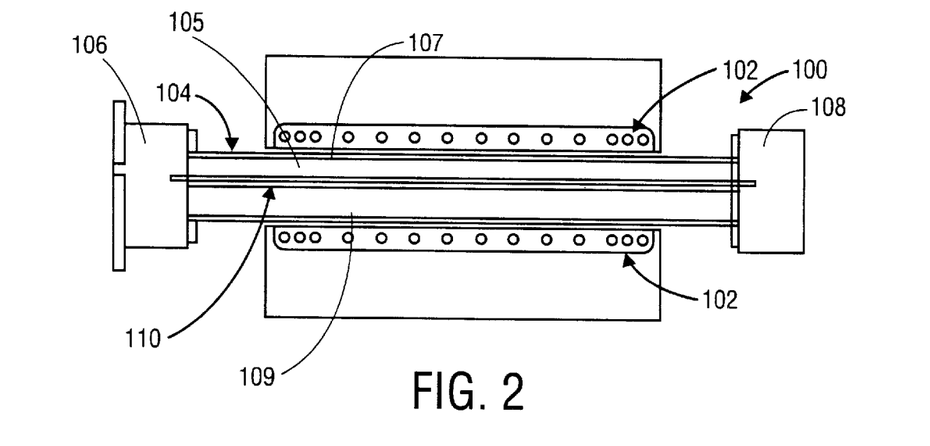
FIG. 2 is a side cross sectional view of the thermal processing chamber of FIG. 1.

Various lamp array configurations can be used in thermal processing chambers for semiconductor substrates. FIGS. 1 and 2 show a process chamber 100 that includes a linear lamp array 102. Process chamber 100 includes a rectangular chamber housing 104. Chamber housing 104 includes an inlet junction 106 and an outlet junction 108. Process gases are sent through the interior 105 (FIG. 2) of the chamber housing 104 from inlet junction 106 to outlet junction 108.

As shown in FIG. 2, a substrate support platform 110 is provided in the interior 105 of the chamber housing 104. Platform 110 can be a susceptor or an edge ring. A susceptor is typically a solid, flat piece of silicon carbidecoated graphite, while an edge ring can be a flat ring with a central opening that exposes the bottom of a substrate being processed to radiant heat from the lamp array. Both susceptors and edge rings can define a substrate holding area that may be a pocket within which the substrate is placed for processing.

As shown in FIG. 2, housing 104 includes a top cover 107 and a bottom cover 109 that surround the interior 105 of the chamber 100. Top cover 107 and bottom cover 109 are typically made of quartz and are transparent to allow radiant heat from heat sources such as lamp arrays 102 to pass through to the substrate (not shown) and platform 110 to be heated.

FIG. 2 shows a process chamber 100 that includes two linear lamp arrays 102. One of the linear lamp arrays is positioned above the chamber housing 104, and the other is positioned below the chamber housing 104. Linear lamp arrays 102 provide radiant heat energy to both sides of the platform 110. The linear lamp array 102 of FIGS. 1 and 2 provides radiant heat in a rectangular pattern to the process chamber housing 104. The linear lamp array is rectangular and provides a uniform heating across the width of the rectangular flow field of the process gases and the substrate support platform, thus enhancing the uniformity of depletion in the flow direction. When a linear lamp array, such as shown in FIGS. 1 and 2, is provided on a process chamber to heat a rectangular flow field and a circular substrate, it is more difficult to control the temperature profile of the circular substrate that is exposed to a non-circular heating pattern. Therefore, non-uniform heating can result on the substrate, which can cause stress in the substrate that produces dislocation of the crystalline structure. This may require other mechanisms to provide uniformity, such as rotating the substrate to average out the temperature distribution on the substrate.

Figure 3:
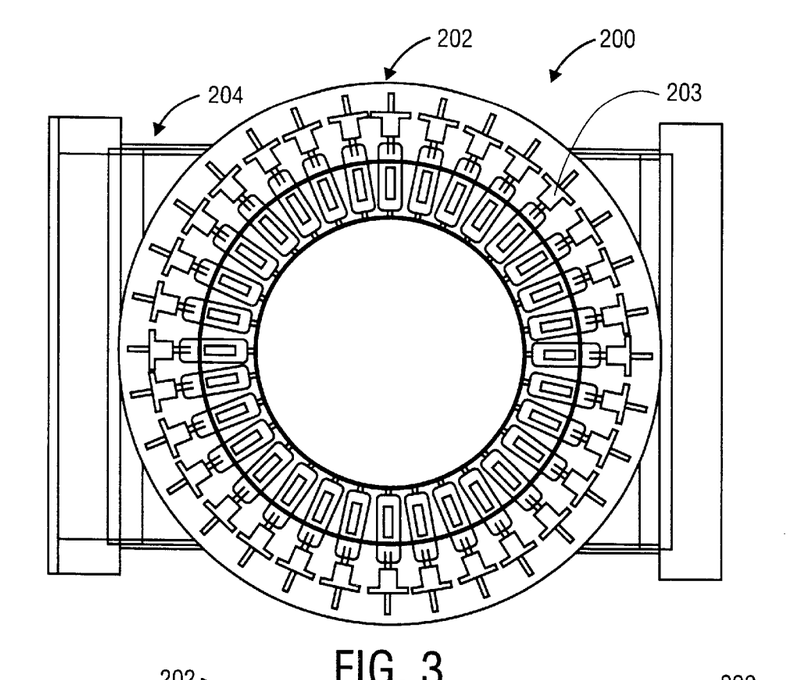
FIG. 3 is a top view of a thermal processing chamber including an annular lamp array.
Figure 4:
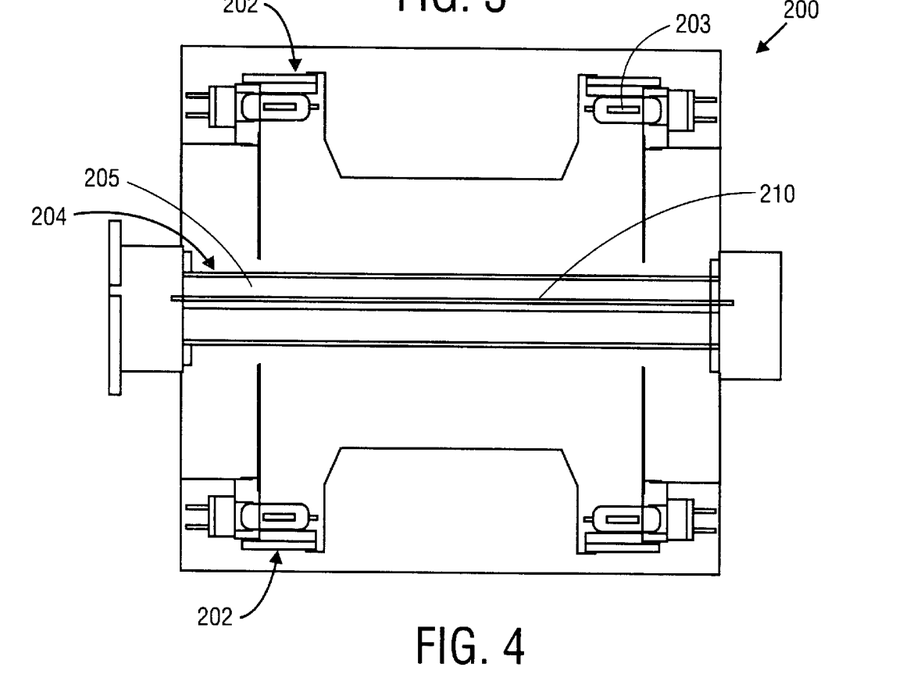
FIG. 4 is a side cross sectional view of the thermal processing chamber of FIG. 3.

FIGS. 3 and 4 show a process chamber 200 that includes a circular lamp array that is embodied in annular lamp array 202. The annular configuration of lamp array 202 provides radiant heating to the interior 205 (FIG. 4) of the process chamber housing 204 with lamps 203 that are set at a particular focal distance from the surface of the substrate in the process chamber. The lamps 203 are typically two kilowatts (KW) each. A lamp array 202 such as that shown in FIGS. 3 and 4 can be used with a chamber enclosure that has a non-flat housing.

Lamp array 202 provides a circular heating pattern to the generally circular substrate (not shown) as it rests on platform 210 (FIG. 4) during processing. A circular heating pattern provides a more uniform thermal profile on the substrate, but may not provide uniform heating across the width of the process gas rectangular flow field. Therefore, a mechanism to rotate the wafer may be necessary to average out the depletion rate of the process gas to provide a more uniform deposition thickness or etching.

Figure 5:
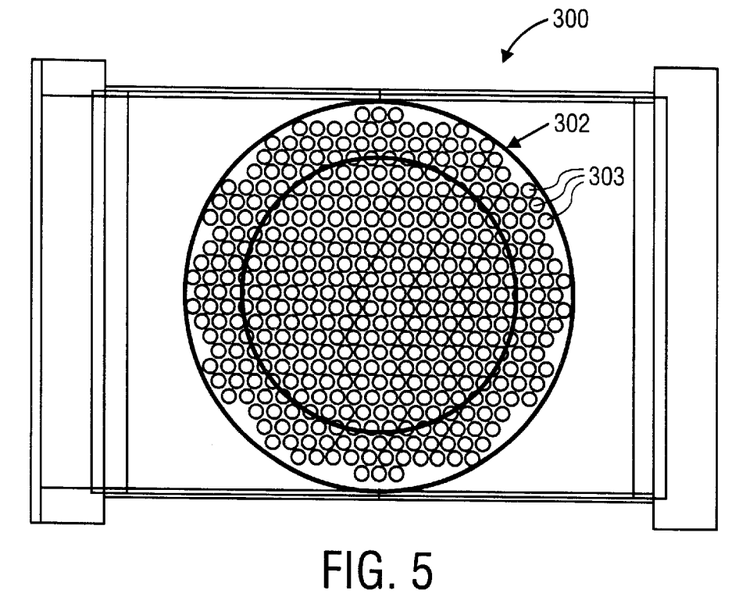
FIG. 5 is a top view of a thermal processing chamber including a honeycomb lamp array.

FIG. 5 shows a process chamber 300 that includes a circular lamp array 302. Circular lamp array 302 includes a plurality of lamps 303 that are arranged in a staggered or "honeycomb" pattern as viewed from above. Lamp array 302 has a large number (over four hundred, for instance) of smaller lamps 303. Because of the large number of lamps 303, each lamp 303 can be of a lower power, such as 750 watts. Lamp array 302 can be provided in larger diameters to accommodate larger wafer sizes without a decrease in power density. However, to maintain an adequate power density, additional lamps 303 would be added. A larger number of lamps increases the chance of failure even though each lamp 303 may be highly reliable.

Figure 6:
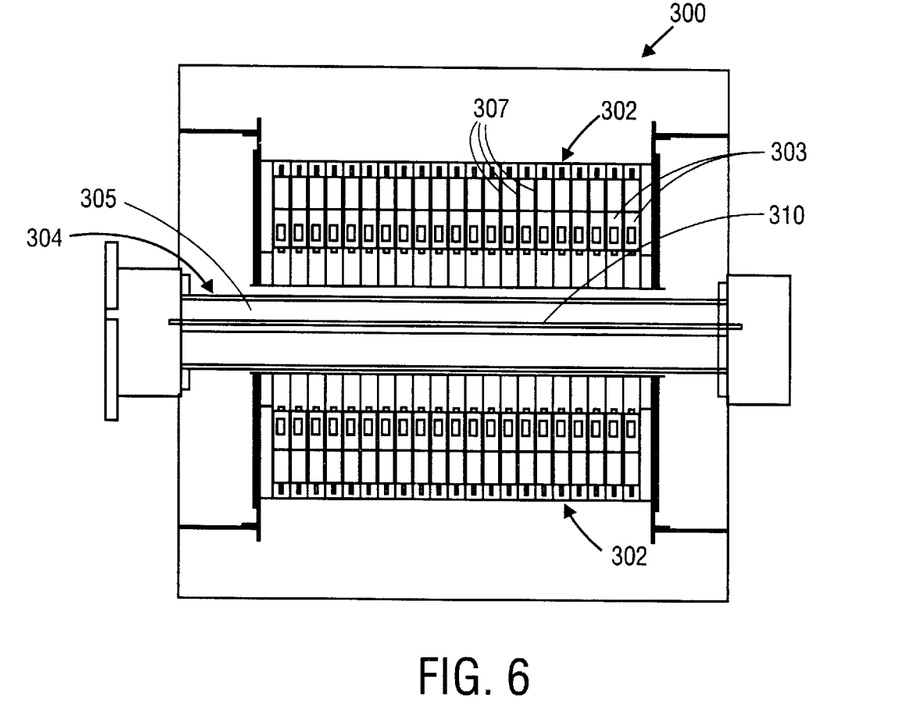
FIG. 6 is a side cross sectional view of the thermal processing chamber of FIG. 5.

As shown in FIG. 6, lamp array 302 of process chamber 300 includes lamps 303 that are mounted in individual tubes 307. Lamps 303 provide radiant heat to the interior 305 of chamber housing 304. During processing, a substrate (not shown) is placed on platform 310 and radiant heat is directed from each lamp 303 onto the substrate (not shown). The tubes 307 serve to confine the output of the light of each lamp to a small area on the substrate that is immediately below the position of the respective lamp. Thus, there is little or no overlap of the radiant heat from each lamp with respect to adjacent lamps. Therefore, other mechanisms such as rotation of the substrate may be necessary to achieve uniformity of temperature at the substrate surface. This type of lamp array includes a large number of lamps, and therefore requires extremely high reliability of each lamp.

Since a circular heating pattern is provided by lamp array 302 of FIGS. 5 and 6, a more uniform thermal profile is provided on the substrate. The rectangular process gas flow field, however, is not uniformly heated across its width as the gas moves across the generally circular substrate.

Figure 7:
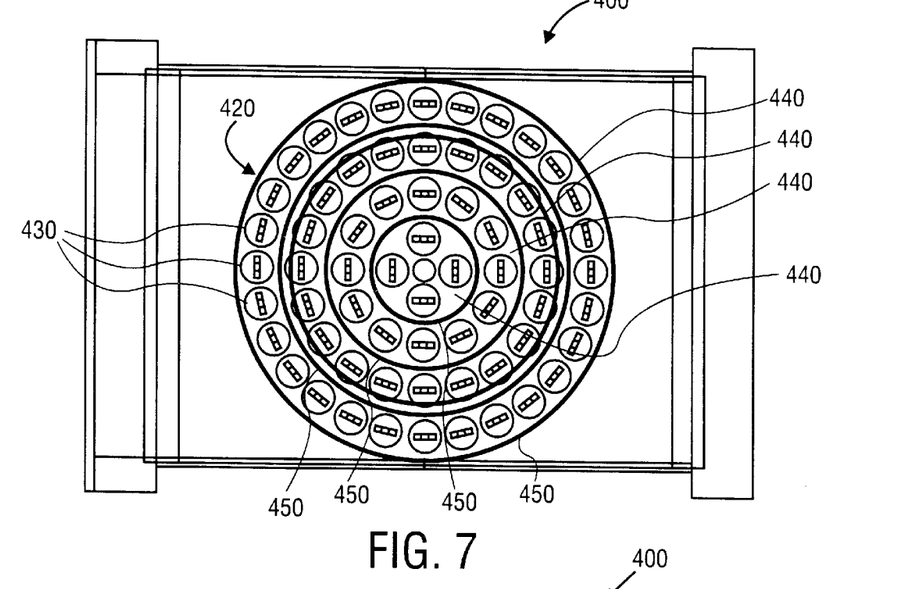
FIG. 7 is a top view of a thermal processing chamber including a concentric ring lamp array.

Chamber 400, shown in FIG. 7, has a lamp array 420 with lamps 430 arranged in concentric rings 440. A ring reflector 450 is positioned between each adjacent concentric ring 440 and at the outer circumference of the lamp array.

The lamps 430 each have a horizontal filament with a reflective surface behind the filament, as described in more detail below, for improved efficiency as compared to the lamps shown in FIGS. 5 and 6. The filaments of lamps 430 are horizontal with respect to the platform 410 of chamber 400, shown in FIG. 8. Alternatively, the filaments can be vertically oriented.

Figure 8:
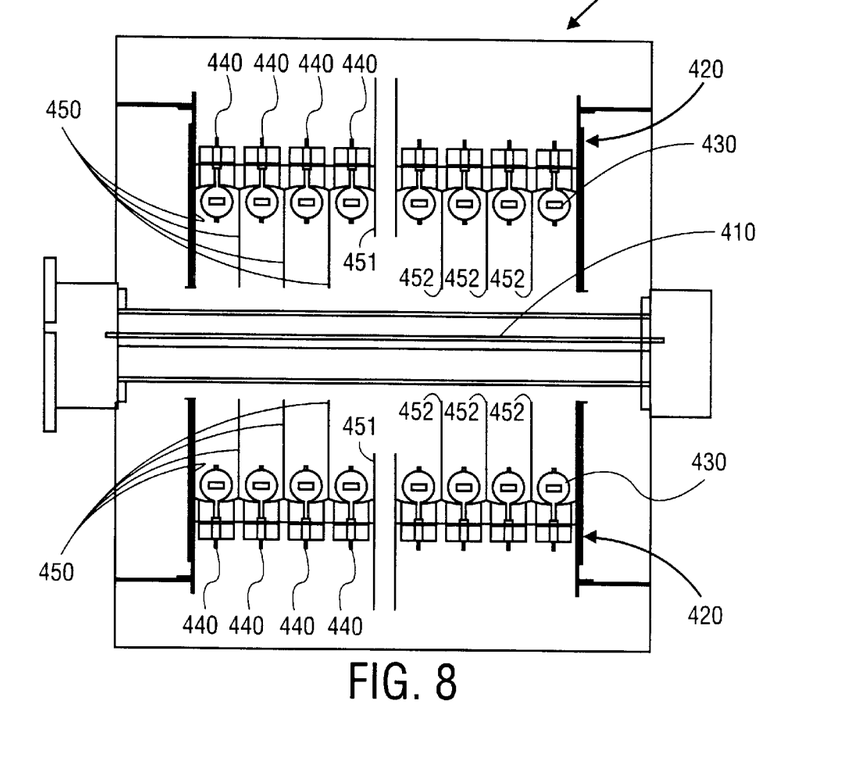
FIG. 8 is a side cross sectional view of the thermal processing chamber of FIG. 7.

The light from each of the lamps 430 of lamp array 420 is allowed to spread and overlap with light from adjacent lamps in the same ring 440. As shown in FIG. 8, ring reflectors 450 are positioned between each concentric ring 440. Ring reflectors 450 are generally cylindrical tubular structures with reflective surfaces. The reflective surfaces between the rings of lamps confine the radiant energy of each ring 440 to an annular area on platform 410 located below the ring of lamps. A central tube 451 is positioned within the innermost concentric ring 440 of lamps. Central tube 451 can provide an optical sight path for an infrared sensor. A substrate (not shown) to be processed is placed on platform 410. The overlap of heating from lamps in the same ring allows for uniform heating without the need to rotate the heated surface.

Light from one ring 440 can have a small overlap with the light from an adjacent ring 440. The length of the ring reflectors 450 and the distance from the bottom ends 452 of the reflectors 450 to the heated surface determines the amount of overlap with light from adjacent rings. As shown in FIG. 8, the ends 452 of the ring reflectors can be relatively close to the heated surface to control the spread of light energy from the lamps 430 of each concentric ring 440. Positioning the ends 452 of the reflectors 450 further from platform 410 allows the energy from each ring 440 to spread to adjacent annular areas on the substrate or platform 410. Overlap of the annular areas corresponding to each ring 440 can result in decreased control of heating in each annular area.

The lamps 430 of lamp array 420 can be positioned closer to platform 410 than the lamps shown in FIG. 4, for example. The closer proximity of lamps to the surface being heated can increase the efficiency of lamp array 420, while the positioning of ends 452 of the reflectors 450 can provide control of the area of heating on the heated surface.

Lamp array 420 can be used to heat a wafer with or without a susceptor to absorb radiant energy. It can also be used for single side heating (not shown) as well as heating from both sides (top and bottom) of a process chamber as shown in FIG. 8.

One distinction between the concentric lamp arrays shown in FIGS. 7–10 and the annular array shown in FIGS. 3 and 4 is that when additional concentric rings are added to the concentric arrays, the available power increases with the square of the diameter. This more closely follows the increase in surface area of the object being heated. In contrast, as the annular array is increased in diameter, the available power increases only linearly with diameter.

Another feature of the concentric ring lamp array is the ability to adjust to different wafer sizes. The exemplary lamp array 420 shown in FIGS. 7 and 8 has four concentric rings 440 with center line diameters of 2.8, 6.8, 10.8 and 14.8 inches. The increment in diameter by adding or subtracting a ring is 4 inches, which nearly corresponds to 100 mm. Common wafer diameters for semiconductor wafers are 200 mm (approximately 8 inches) and 300 mm (approximately 12 inches). This lamp configuration could easily be adapted for 400 mm wafers by adding another ring 440 of lamps.

The rings shown in FIG. 7 have 4, 12, 20, and 28 lamps respectively. An additional ring would contain 36 lamps, which would be a 56% increase in available power, which would correspond to the increase in heated surface area of the larger wafer.

In contrast, referring again to FIG. 3, lamp array 302, when expanded from a 14.8 inch diameter (for 300 mm wafers) to an 18.8 inch diameter (for 400 mm wafers), would result in an increase in the number of lamps from 32 to 40. This would result in only a 25% increase in available power, which is effectively a decreased power density compared to the increase in heated surface area. Thus, more powerful lamps would be necessary in a larger diameter annular array to provide an adequate power density.

Figure 9:
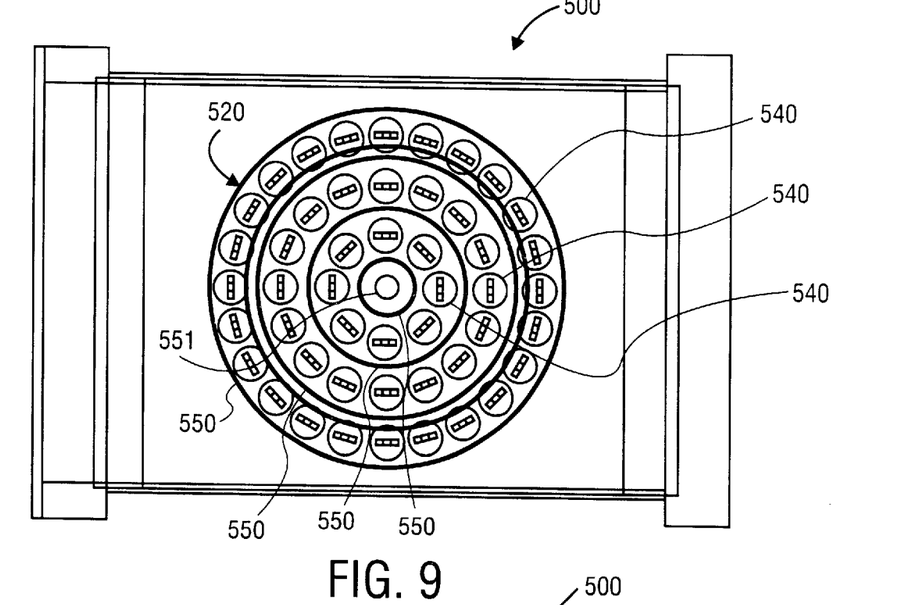
FIG. 9 is a top view of a thermal processing chamber including another embodiment of a concentric ring lamp array.
Figure 10:
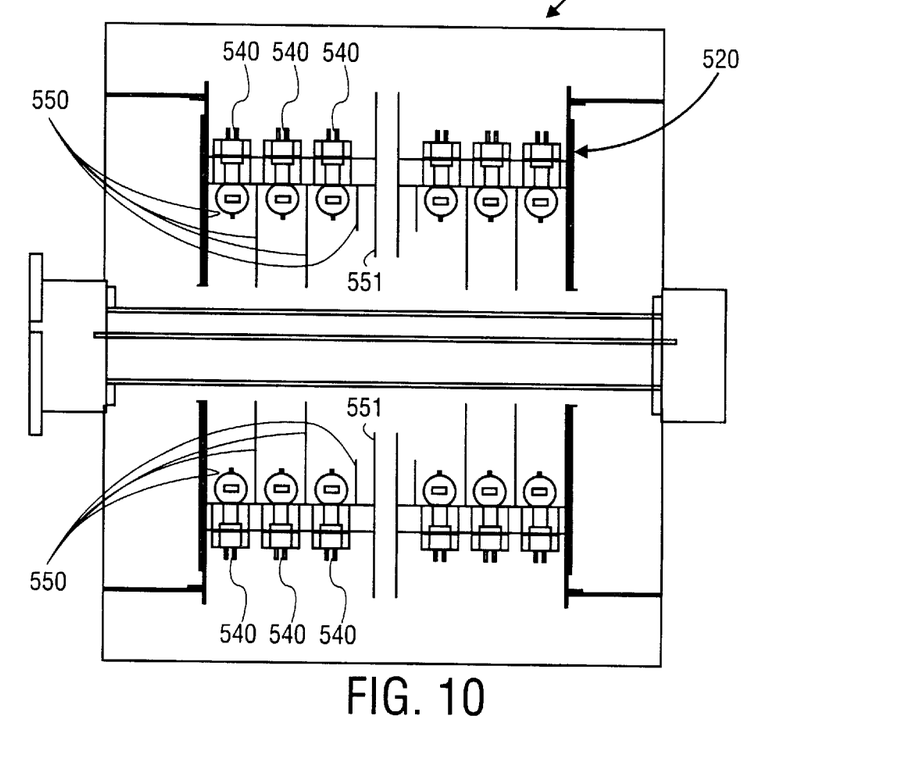
FIG. 10 is a side cross sectional view of thermal processing chamber of FIG. 9.

Another process chamber 500 with an alternative concentric lamp array 520 is shown in FIGS. 9 and 10. Lamp array 520 can also be used for 300 mm wafers. Lamp array 520 has three concentric rings 540 with center line diameters of 4.6, 8.8, and 13.0 inches. This lamp array can also be adjusted in approximately 100 mm increments to accommodate different wafer sizes by adding an additional outer ring.

Also, lamp array 520 includes ring reflectors 550 that are similar to ring reflectors shown in FIGS. 7 and 8. Central tube 551 can provide an optical sight path for an infrared sensor. As shown in FIG. 10, the innermost ring reflector 550 can be shorter in length such that the radiant energy from the innermost concentric ring of lamps is overlapped to provide a disk-shaped pattern on the surface to be heated. The relative lengths of the innermost ring reflectors 550 and the central tube 551 can also be selected to provide an optimal amount of overlap so as to avoid an uneven heating pattern.

Figure 11:
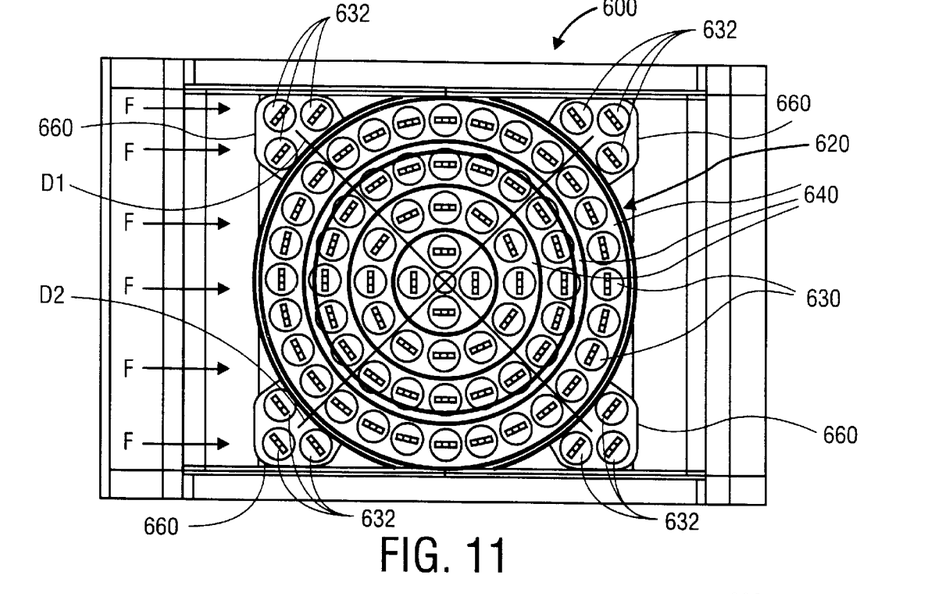
FIG. 11 is a top view of a thermal processing chamber including a concentric ring lamp array having corner lamp arrays.

FIG. 11 shows processing chamber 600 including another embodiment of a concentric lamp array 620. Lamp array 620 can include a plurality of lamps 630 arranged in a plurality of concentric rings 640, in a manner similar to previously described embodiments.

In addition to the concentric rings 640 which provide a circular heating pattern, corner lamps arrays 660 are provided at preferably four locations around the circumference of the outermost concentric ring 640 of lamp array 620. Corner lamp arrays 660 include at least one lamp 632.

The outermost one of the concentric rings 640 defines two diameters, indicated in FIG. 11 as line segments D1 and D2 passing through the center of the circles defined by concentric rings 640. At least one corner lamp 632 is located adjacent the outermost ring at each end of each of the two diameters D1 and D2. As shown in FIG. 11, corner lamp arrays 660 each include three corner lamps 632. Corner lamps 632, as shown in FIG. 11, are arranged in a generally triangular arrangement within each corner lamp array 660. Also, corner lamp arrays 660 are located around the circumference of the outermost concentric ring 640 at generally equally spaced-apart locations around the circumference. In the arrangement of lamp array 620 shown in FIG. 11, the diameters, represented by lines D1 and D2 are generally perpendicular to each other. In an alternate embodiment, diameters D1 and D2 need not be perpendicular. Consequently, corner lamp arrays 660, being located at the ends of each diameter, would not be equidistant from each other around the circumference of the outermost circular ring 640.

As shown in FIG. 11, the arrangement of lamps 630 in the concentric rings 640 together with the corner lamps 632 provide a generally rectangular heating pattern. Thus, the flow of process gases, represented by arrows F in FIG. 11, can be heated evenly across the entire width of the flow field within rectangular process chamber 600. At the same time, a circular heating pattern created by the concentric rings 640 provides a more desirable temperature profile on the circular substrate being processed.

Figure 12:
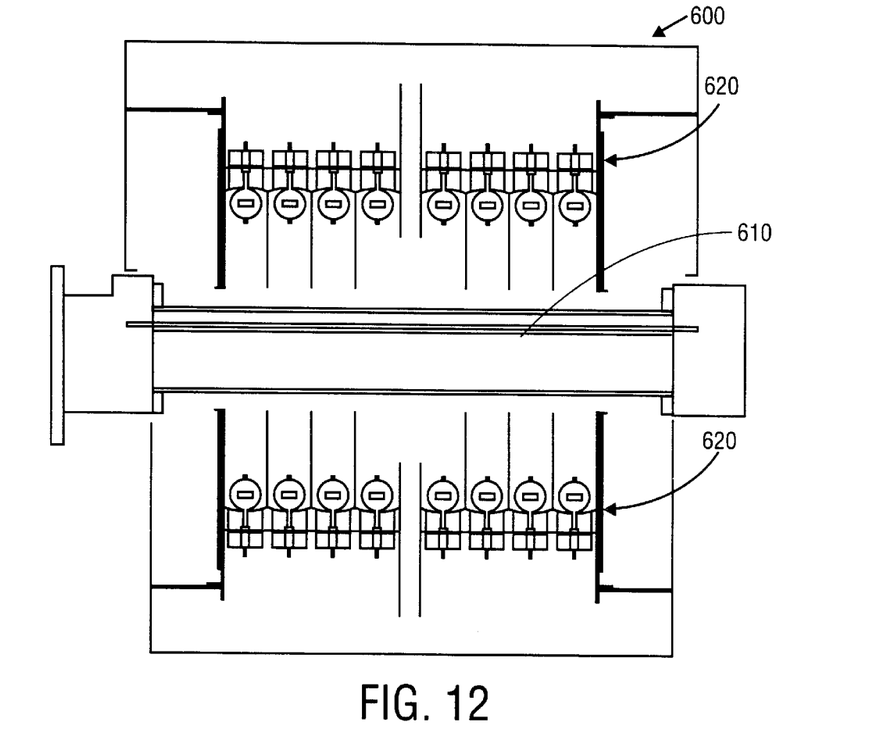
FIG. 12 is a side cross sectional view of the thermal processing chamber of FIG. 11.

FIG. 12 shows a side view of process chamber 600 showing lamp arrays 620 positioned both above and below platform 610.

Figure 13:
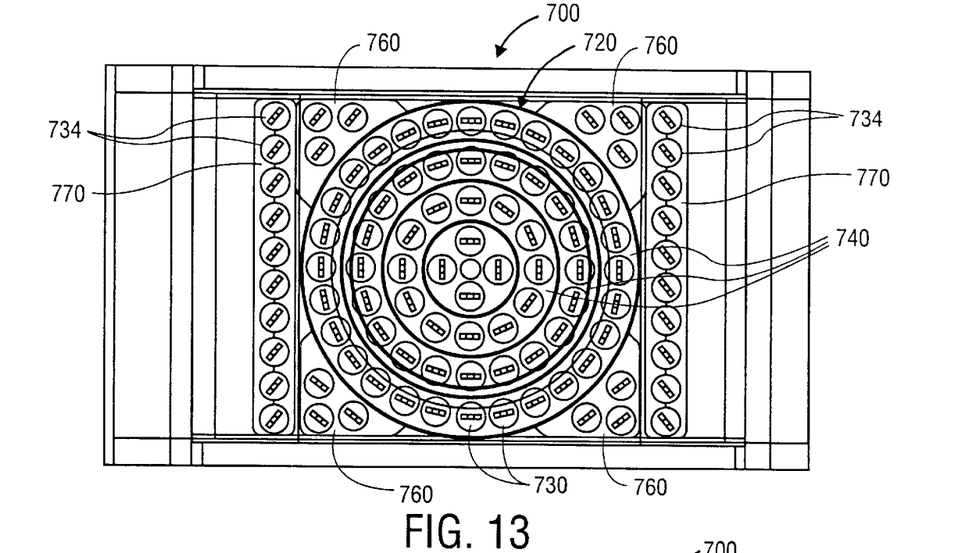
FIG. 13 is a top view of a thermal processing chamber including a lamp array having corner lamp arrays and rows of end lamps.

FIG. 13 shows yet another embodiment of a processing chamber 700 that includes lamp array 720. Lamp array 720 includes a circular group of lamps 730 that are preferably arranged in concentric rings 740 that are similar to previously described embodiments. Lamp array 720 further includes corner lamp arrays 760 that can be arranged in a manner similar to that shown in FIG. 11. Additionally, the embodiment of lamp array 720 shown in FIG. 13 includes at least one row 770 of end lamps 734. While FIG. 13 shows two rows 770 of end lamps 734, one near each end of the chamber, it should be noted that only one row 770 may be provided. Also, multiple rows 770 can be provided at either or both of the upstream or downstream ends of the chamber.

Rows 770 of end lamps are positioned generally tangentially to the outermost concentric ring 740, or tangentially to the outer circumference of the circular portion of the lamp array. It should be noted that the corner lamp arrays of FIGS. 11 and 13 and the rows of end lamps of FIG. 13 are not limited to use with lamp arrays having concentric rings of lamps. Corner lamp arrays and rows of end lamps such as those shown in FIG. 13 can be used with generally any lamp array having a circular arrangement of lamps.

As shown in FIG. 13, corner lamp arrays 760 are positioned at equidistant points around the circumference of the outermost concentric ring 740 of lamps 730. Thus, a generally rectangular heating pattern can be provided, while retaining the benefits of the circular heating pattern of a circular lamp array. The rows 770 of end lamps 734 provide an extended heating zone for the lamp array 720 to improve the preheating and postheating of the process gases flowing through rectangular processing chamber 700. The rows of end lamps can be independently powered from the circular portion of lamp array 720 and the corner lamp arrays 760.

The thermal breakdown of process gases in the flow direction provides two effects on the deposition gases. First, the gases must be thermally activated to provide the atomic or molecular species needed for reaction at the surface of the substrate. The thermal activation can be improved by providing additional time for the thermal decomposition to take place. Extension of the heating zone in the upstream direction by adding a row 770 of end lamps provides the additional time for the decomposition of the process gases to occur before the process gases flow over the vicinity of the substrate being processed.

A second effect of the thermal breakdown of the process gases is that the reaction products become thermally stable so that they do not deposit on the walls of the exhaust portion of the process chamber. For this reason it is desirable to continue to heat the gases after they have passed through the process zone. The process zone is generally the area above the circular substrate as it rests in the process chamber. A second row 770 of end lamps is preferably provided to continue heating the process gases such that deposition of the molecular species does not occur on the walls of the exhaust portion of the process chamber, necessitating additional cleaning of the chamber.

Figure 14:
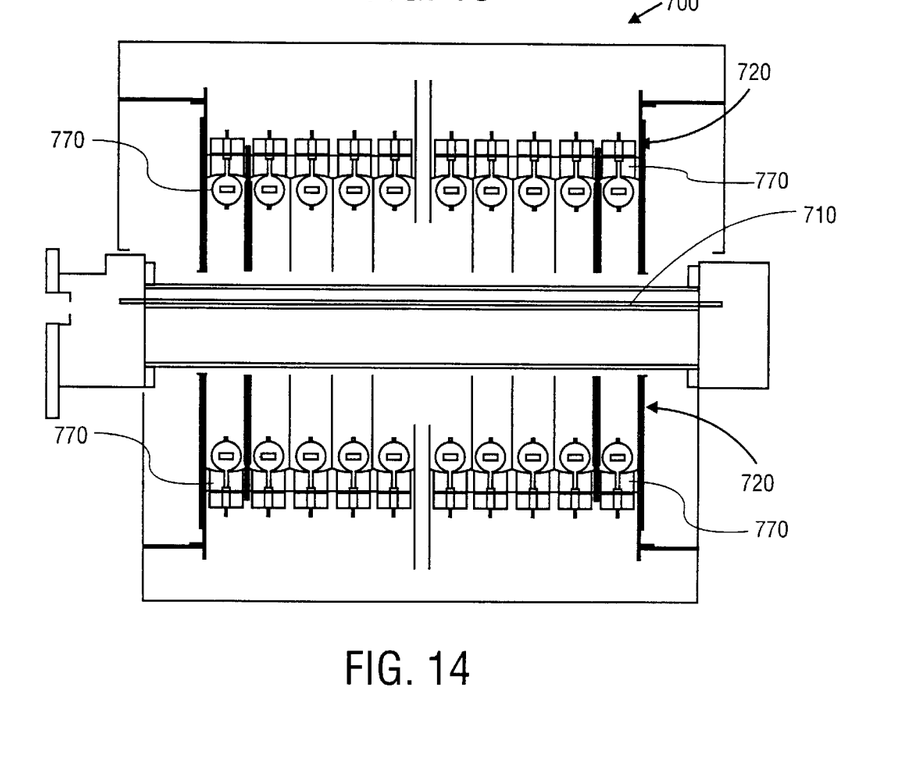
FIG. 14 is a side cross sectional view of the thermal processing chamber of FIG. 13.

FIG. 14 shows process chamber 700 including a lamp array 720 positioned above the platform 710 on which the substrate to be processed rests. Second lamp array 720 can also be provided below platform 710. FIG. 14 also shows rows 770 of end lamps at each side of the lamp array 720.

Figure 15A:
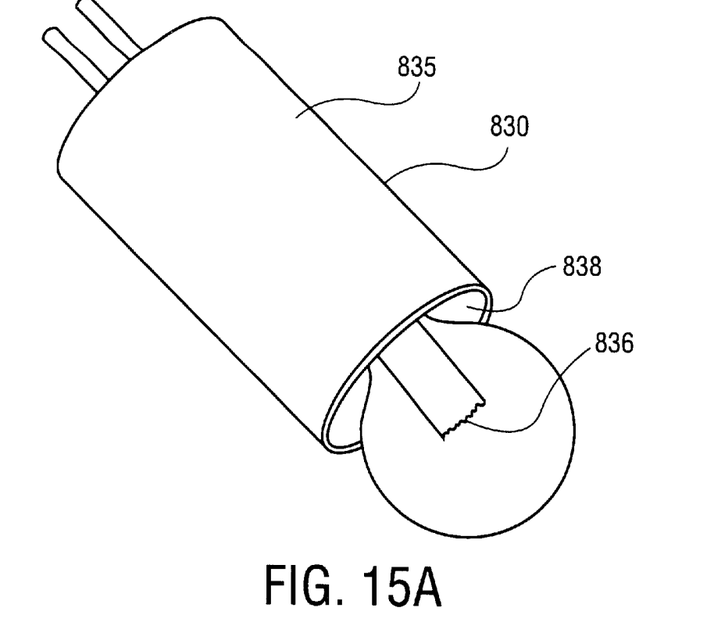
FIG. 15A is a perspective view of one embodiment of a lamp.

FIG. 15A shows a lamp 830 that can be used in the embodiments of the lamp arrays previously described. Lamp 830 includes a generally cylindrical body 835 and a filament 836 that is positioned generally perpendicular to the longitudinal axis of the body 835. A reflective surface 838 is provided behind the filament 836 to direct the radiant energy admitted from the lamp. Reflective surface 838 can be any shape, flat, conical, or parabolic, for example. In the various embodiments of the lamp arrays described herein that include concentric rings of a plurality of lamps such as lamp 830, a lesser number of lamps are required, thus increasing reliability of the concentric ring lamp arrays.

Figure 15B:
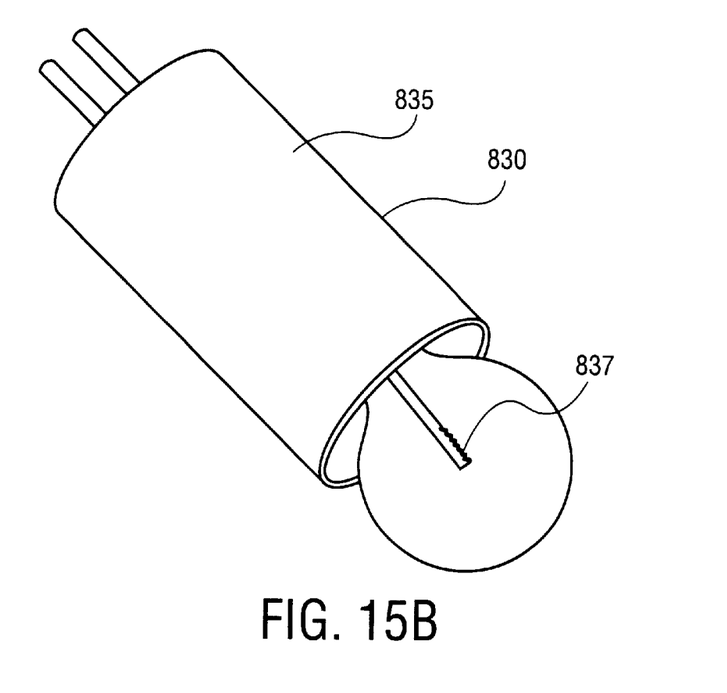
FIG. 15B is a perspective view of another embodiment of a lamp.

FIG. 15B shows an alternative filament 837 orientation, which is generally parallel to the longitudinal axis of the body 835 of lamp 830.

Figure 16:
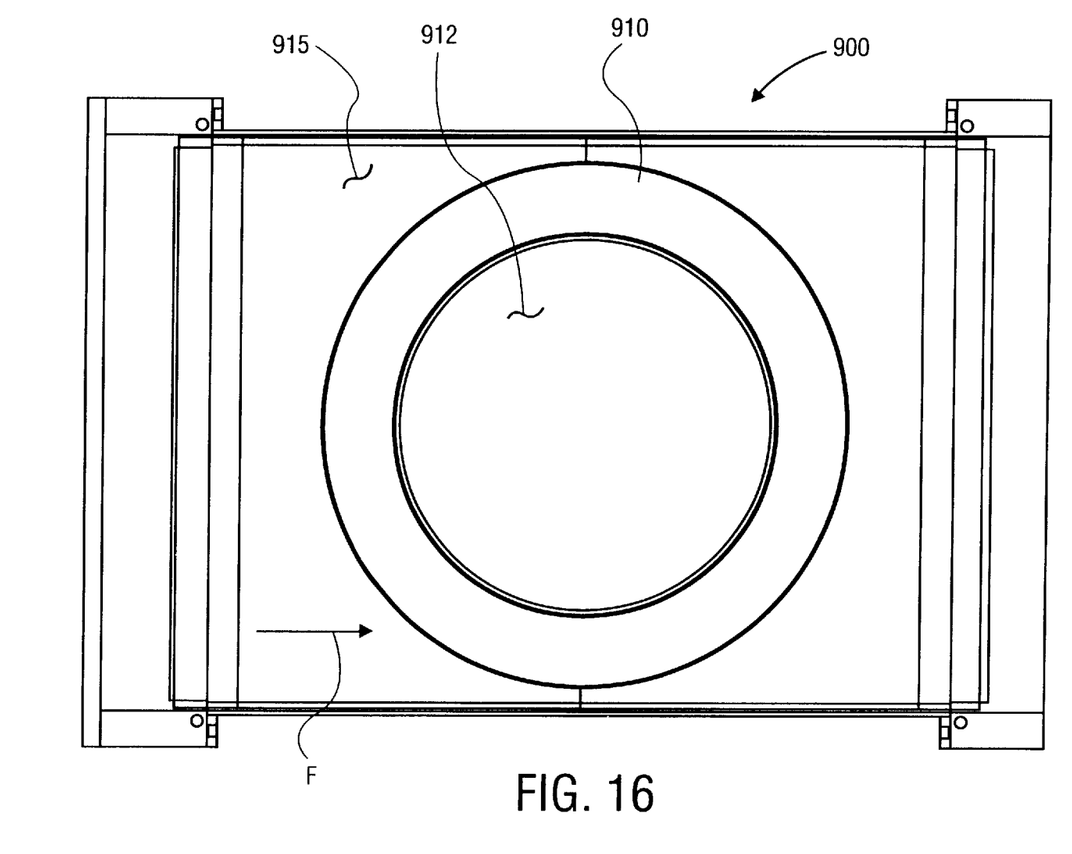
FIG. 16 is a top view of a thermal processing chamber.

FIG. 16 shows a process chamber 900 including a circular substrate platform 910 and a rectangular tray 915 surrounding platform 910. Tray 915 is a generally rectangular flat member having a circular opening to accommodate platform 910. Platform 910 can be a susceptor or an edge ring that holds the wafer to be processed. FIG. 16 shows a platform 910 and a tray 915 that are preferably used with lamp arrays of the type shown in FIGS. 7–10. The heating pattern provided by the lamp arrays of FIGS. 7–10 is a circular heating pattern that generally covers only the area of the circular platform 910 including the substrate holding area 912 that is centrally located on platform 910. Platform 910 can be a susceptor or edge ring that is typically made of silicon carbide-coated graphite or solid silicon carbide. The tray area 915, which is the area outside of the circumference of the platform 910, can be made of quartz, graphite, silicon carbide-coated graphite, solid silicon carbide, or polysilicon because the tray 915 is not directly heated by the circular heating pattern of the lamp arrays of the type shown in FIG. 7–10.

Figure 17:
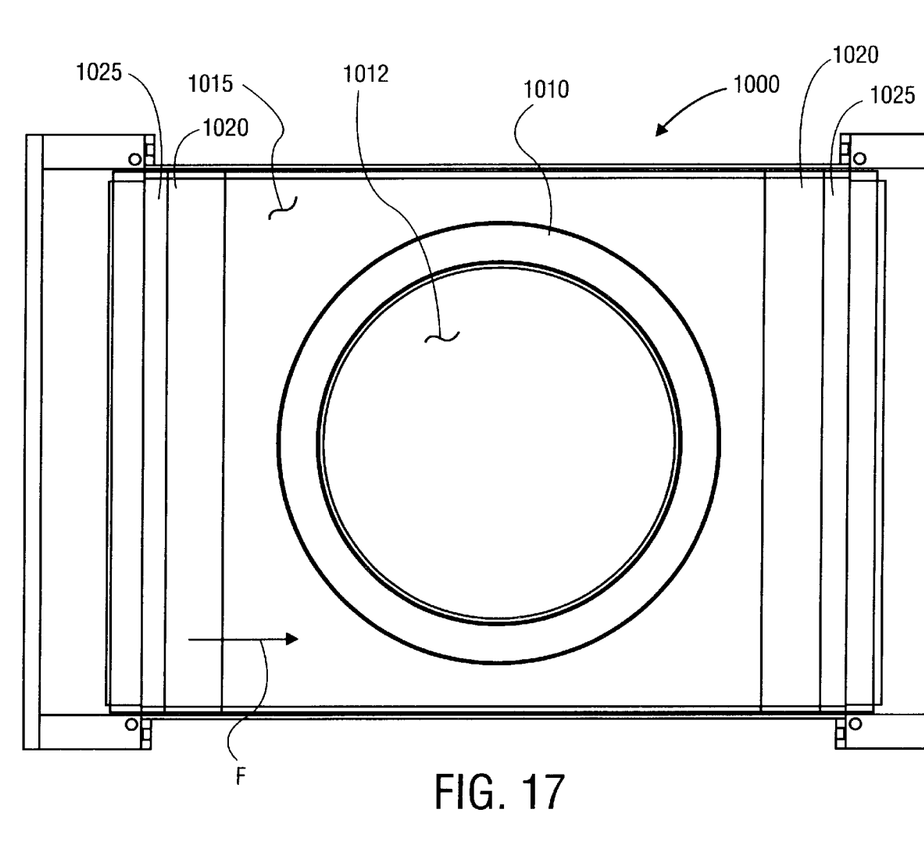
FIG. 17 is a top view of another embodiment of the thermal processing chamber.

In contrast, FIG. 17 shows a processing chamber 1000 that is preferably used with lamp arrays of the type shown in FIGS. 11–14. Lamp arrays such as those shown in FIGS. 11–14 include corner lamp arrays and may further include rows of end lamps, as previously described. In processing chambers using these lamp arrays, the circular platform 1010 including the substrate holding area 1012 is heated by the circular portion of the lamp array. Additionally, the tray area 1015 is directly heated by the lamp array because of the corner lamp arrays and also by the rows of end lamps, if provided.

As shown in FIG. 17, the platform 1010 can be reduced in diameter, while the diameter of the substrate holding area 1012 remains the same as that shown in FIG. 16. Because the platform 1010 has a reduced diameter, the circular portion of the lamp array can be larger in diameter than the platform 1010. Thus, the lamp array provides a circular heating pattern that overlaps the edge of the platform 1010 and heats both the tray 1015 and the platform 1010. The corner lamps heat the corner areas of the tray 1015 to provide a rectangular heated zone in the process chamber. In this case, it is preferable that the tray 1015 be made of silicon carbide-coated graphite so that it will absorb heat uniformly with the platform 1010, which is preferably made of the same material as the tray 1015.

Other trays 1020 may be located outside of the heated zone and can be made of quartz, silicon carbide-coated graphite, solid silicon carbide, or polysilicon because they are not heated. Trays 1025 extend to the junctions and can extend into the junctions. Trays 1020 and 1025 can allow large temperature variations between the heated zone and the outer portions of the chamber. These trays provide isolation of the process gas in the upper part of the chamber from the purged region in the lower part of the chamber.

What is claimed is:

1. A lamp array for a thermal processing chamber, the lamp array comprising:
   a plurality of lamps arranged in a generally circular array, said circular array defining two diameters; and
   at least one corner lamp adjacent said circular array at at least one end of at least one of said two diameters.

2. The lamp array of claim 1, wherein said lamp array provides a pattern of radiant heat that is generally rectangular.

3. The lamp array of claim 1, wherein said circular array includes at least two concentric rings of lamp.

4. The lamp array of claim 1, further comprising a row of end lamps positioned generally tangentially to said circular array.

5. The lamp array of claim 1, further comprising a linear lamp positioned generally tangentially to said circular array.

6. A thermal processing chamber comprising:
   a platform defining a semiconductor substrate holding area;
   a first lamp array including a plurality of lamps arranged in a generally circular array, said circular array having two diameters; and
   at least one lamp adjacent said circular array at each end of each of said two diameters.

7. The chamber of claim 6, wherein said lamp array provides a pattern of radiant heat that is generally rectangular.

8. The chamber of claim 6, wherein said circular array includes at least two concentric rings of lamps.

9. The lamp array of claim 6, further comprising a row of end lamps positioned generally tangentially to said circular array.

10. The lamp array of claim 6, further comprising a linear lamp positioned generally tangentially to said circular array.

11. A lamp array for a thermal processing chamber, the lamp array comprising:
    a plurality of lamps arranged in at least two concentric rings, wherein the outermost one of said at least two concentric rings defines two diameters; and
    at least one corner lamp adjacent said outermost concentric ring at each end of each of said two diameters.

12. The lamp array of claim 11, further comprising a ring reflector between each of said concentric rings.

13. The lamp array of claim 11, wherein each of said lamps has a longitudinal axis and a filament generally perpendicular to said longitudinal axis.

14. The lamp array of claim 13, wherein each of said lamps includes a reflective surface to direct light from said lamp generally along said longitudinal axis.

15. The lamp array of claim 13, wherein said concentric rings have a common central axis and said longitudinal axes of said lamps are generally parallel to said central axis.

16. The lamp array of claim 11, wherein each of said concentric rings has an inner circumference, an outer circumference, and a center line circumference halfway between said inner circumference and said outer circumference.

17. The lamp array of claim 16, wherein each successive concentric ring has a center line circumference having a diameter of about four inches in length larger than the previous inwardly adjacent concentric ring.

18. The lamp array of claim 11, further comprising a row of end lamps positioned generally tangentially to said outermost concentric ring.

19. The lamp array of claim 11, further comprising a linear lamp positioned generally tangentially to said outermost concentric ring.

20. A thermal processing chamber comprising:
    a platform defining a semiconductor substrate holding area;
    a first lamp array having a plurality of lamps arranged in at least two concentric rings, said first lamp array positioned relative to said platform such that said first lamp array provides radiant heat to said semiconductor substrate holding area, wherein the outermost one of said at least two concentric rings defines two diameters; and
    at least one corner lamp adjacent said outermost concentric ring at each end of each of said two diameters.

21. The chamber of claim 20, further comprising a ring reflector between each of said concentric rings.

22. The chamber of claim 20, wherein each of said lamps has a longitudinal axis and a filament generally perpendicular to said longitudinal axis.

23. The chamber of claim 20, wherein each of said lamps includes a reflective surface to direct light from said lamp generally along said longitudinal axis.

24. The chamber of claim 22, wherein said concentric rings have a common central axis and said longitudinal axes of said lamps are generally parallel to said central axis.

25. The chamber of claim 20, wherein said platform has a top side and a bottom side, and wherein said chamber includes a second lamp array, one of said first and second lamp arrays positioned to provide radiant heat to said top side of said platform, and the other of said first and second lamp arrays positioned to provide radiant heat to said bottom side of said platform.

26. The processing chamber of claim 20, further comprising a row of end lamps positioned generally tangentially to said outermost concentric ring.

27. The chamber of claim 20, further comprising a linear lamp positioned generally tangentially to said outermost concentric ring.

28. A method for thermally processing a semiconductor substrate, the method comprising:

heating the substrate in a processing chamber, said processing chamber including a lamp array having a plurality of lamps arranged in a generally circular array, said circular array defining two diameters, said lamp array further including at least one corner lamp adjacent said circular array at each end of each of said two diameters.

29. The method of claim 28, further comprising providing a generally rectangular pattern of radiant heat to said processing chamber from said lamp array.

30. The method of claim 28, wherein said processing chamber further includes a row of end lamps positioned generally tangentially to said circular array.

31. The method of claim 28, wherein said processing chamber further includes a linear lamp positioned generally tangentially to said circular array.

32. A method for thermally processing a semiconductor substrate, the method comprising:

heating the substrate in a processing chamber, said processing chamber including a lamp array having a plurality of lamps arranged in at least two concentric rings, wherein the outermost one of said at least two concentric rings defines two diameters, and said lamp array further having at least one corner lamp adjacent said outermost concentric ring at each end of each of said two diameters.

33. The method of claim 32, further comprising providing a generally rectangular pattern of radiant heat to said processing chamber from said lamp array.

34. The method of claim 32, wherein said processing chamber further includes a row of end lamps positioned generally tangentially to said outermost concentric ring.

35. The method of claim 32, wherein said processing chamber further includes a linear lamp positioned generally tangentially to said outermost concentric ring.

* * * * *